US010014861B2

(12) United States Patent
Luthra (10) Patent No.: US 10,014,861 B2
(45) Date of Patent: *Jul. 3, 2018

(54) LEVEL SHIFTERS, MEMORY SYSTEMS, AND LEVEL SHIFTING METHODS

(71) Applicant: Micron Technology, Inc., Boise, ID (US)

(72) Inventor: Yogesh Luthra, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/144,421

(22) Filed: May 2, 2016

(65) Prior Publication Data

US 2016/0248424 A1    Aug. 25, 2016

Related U.S. Application Data

(63) Continuation of application No. 14/150,228, filed on Jan. 8, 2014, now Pat. No. 9,331,699.

(51) Int. Cl.
*G11C 7/00* (2006.01)
*H03K 19/00* (2006.01)
*H03K 19/0185* (2006.01)
*G11C 13/00* (2006.01)
*G11C 5/14* (2006.01)
(Continued)

(52) U.S. Cl.
CPC ......... *H03K 19/0013* (2013.01); *G11C 5/145* (2013.01); *G11C 5/147* (2013.01); *G11C 7/12* (2013.01); *G11C 11/4074* (2013.01); *G11C 13/0069* (2013.01); *H03K 19/018571* (2013.01); *G11C 7/1084* (2013.01);
(Continued)

(58) Field of Classification Search
CPC ........................................................ G11C 8/08
USPC .................................................. 365/189.11
See application file for complete search history.

(56) References Cited

U.S. PATENT DOCUMENTS 9,331,699 B2 * 5/2016 Luthra ........... H03K 19/018571
2003/0042965 A1    3/2003 Kanno et al.
(Continued)

OTHER PUBLICATIONS

Chen et al., "Subthreshold to Above Threshold Level Shifter Design", Journal of Low Power Electronics vol. 2, No. 2, 2006, United States, pp. 251-258.
(Continued)

*Primary Examiner* — Hoai V Ho
(74) *Attorney, Agent, or Firm* — Wells St. John P.S.

(57) ABSTRACT

Level shifters, memory systems, and level shifting methods are described. According to one arrangement, a level shifter includes an input configured to receive an input signal in a first voltage domain, an output configured to output an output signal from the level shifter in a second voltage domain different than the first voltage domain, a plurality of pull-down devices, and wherein one of the pull-down devices is coupled with the input and the output, a plurality of cross-coupled devices coupled with the pull-down devices and configured to provide transitions in the output signal as a result of transitions in the input signal, a plurality of current limiting devices coupled with the cross-coupled devices and configured to limit a flow of current from a source to the cross-coupled devices, and a plurality of dynamic devices configured to selectively provide charging current from the source to the cross-coupled devices.

31 Claims, 3 Drawing Sheets

(51) Int. Cl.
  *G11C 11/4074* (2006.01)
  *G11C 7/12* (2006.01)
  *G11C 7/10* (2006.01)
  *G11C 11/4093* (2006.01)

(52) U.S. Cl.
  CPC ....... *G11C 11/4093* (2013.01); *G11C 13/0011* (2013.01); *G11C 13/0023* (2013.01); *G11C 13/0038* (2013.01)

(56) References Cited

U.S. PATENT DOCUMENTS

| | | |
|---|---|---|
| 2006/0208759 A1* | 9/2006 | Nojiri .................... H03K 3/012 326/81 |
| 2008/0074148 A1 | 3/2008 | Srivastava et al. |
| 2008/0136489 A1* | 6/2008 | Nojiri .................... H03K 3/012 327/333 |
| 2009/0251941 A1 | 10/2009 | Saito |
| 2012/0280739 A1 | 11/2012 | Foley |
| 2015/0194961 A1 | 7/2015 | Luthra |

OTHER PUBLICATIONS

Lutkemeier et al., "A Subthreshold to Above-Threshold Level Shifter Comprising a Wilson Current Mirror", IEEE Transactions on Circuits and Systems vol. 57, No. 9, Sep. 2010, United States, pp. 721-724.

\* cited by examiner

LEVEL SHIFTERS, MEMORY SYSTEMS, AND LEVEL SHIFTING METHODS

RELATED PATENT DATA

This application is a continuation of and claims priority to U.S. patent application Ser. No. 14/150,228, filed Jan. 8, 2014, titled "Level Shifters, Memory Systems, and Level Shifting Methods", and the teachings of which are incorporated herein by reference.

TECHNICAL FIELD

Embodiments disclosed herein pertain to level shifters, memory systems, and level shifting methods.

BACKGROUND

Level shifters are known in the prior art and are utilized to convert signals in a certain voltage domain to signals in another voltage domain. For example, level shifters may convert signals in a lower voltage domain (e.g., 0-1 V) to corresponding signals in a higher voltage domain (e.g., 0-5 V). In some applications, level shifters are used to implement operations in memory applications to store digital information using a plurality of memory cells.

Numerous parameters are considered in the design of level shifters for use in memory. For example, level shifters are designed for robustness across technology process corners and to operate at fast speeds. In addition, some memory arrangements may use thousands of level shifters, and accordingly, real estate, I/O delay and power requirements of the level shifters are also considered in memory designs.

At least some embodiments are directed towards level shifters, memories, and level shifting methods as described more fully below.

DETAILED DESCRIPTION OF EXAMPLE EMBODIMENTS

At least some embodiments of the disclosure are directed to level shifters and level shifting methods. The circuits and methods are described below in a memory application in one example. The circuits and methods described below utilize acceptable real estate as well as provide reduced power consumption and increased speed compared with some conventional arrangements. The level shifters and level shifting methods may be used in other applications in other embodiments.

Figure 1:
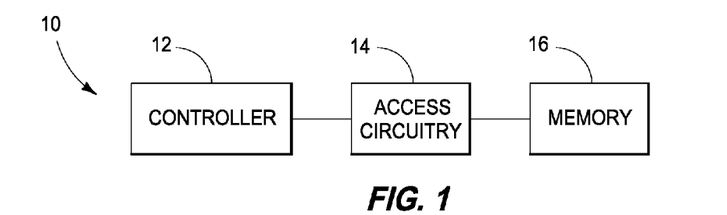
FIG. 1 is a block diagram of a memory system according to one embodiment.

Referring to FIG. 1, a functional block diagram of a memory system 10 is shown according to one embodiment. The illustrated memory system 10 includes a controller 12, access circuitry 14, and memory 16. Memory system 10 may be implemented within or with respect to various associated devices (not shown), such as computers, cameras, media players, and thumb drives, in some examples. Memory system 10 stores data generated or utilized by the associated devices in the described examples. Other embodiments of memory system 10 are possible and may include more, less and/or alternative components or circuitry.

Controller 12 controls operations of writing, reading and re-writing data of memory 16 as well as interfacing with other components or circuitry, such as sources of data to be stored within memory 16. Controller 12 may access and process commands with respect to memory 16 during operations of an associated device. Example commands instruct the generation of write signals, which may also be referred to as program signals, of appropriate voltage potentials which are applied to memory 16 in one embodiment. The write signals are used to write data to memory (i.e., program the memory) in one embodiment. Controller 12 may also control the application of read and verify pulses to memory 16 to read and verify stored data in one embodiment.

In one embodiment, controller 12 is configured to process data, control data access and storage, issue commands, and control other desired operations. Controller 12 may comprise processing circuitry configured to execute programming provided by appropriate computer-readable storage media (e.g., memory) in at least one embodiment. For example, the controller 12 may be implemented as one or more microcontroller(s), processor(s) and/or other structure configured to execute executable instructions including, for example, software and/or firmware instructions. These examples of controller 12 are for illustration and other configurations are possible.

Access circuitry 14 is coupled with controller 12 and memory 16 and is configured to implement addressing (selection of columns and rows of memory 16), writing, reading, verifying and re-writing operations with respect to memory cells of memory 16 in one embodiment. For example, access circuitry 14 may receive instructions from controller 12 to select a specific block, page, word or byte of the memory 16 as well as to implement writing, reading, verifying and re-writing with respect to a plurality of cells of the selected block, page, word or byte. As discussed below, the access circuitry 14 may apply electrical voltage potentials to the memory 16 to perform write, read and verification operations in one embodiment.

Memory 16 may be implemented in different arrangements in different embodiments. For example, the memory 16 may be implemented within a memory device, such as a chip, a portion of the chip or other arrangements. The memory device may also include controller 12 and/or access circuitry 14 or portions thereof.

Figure 2:
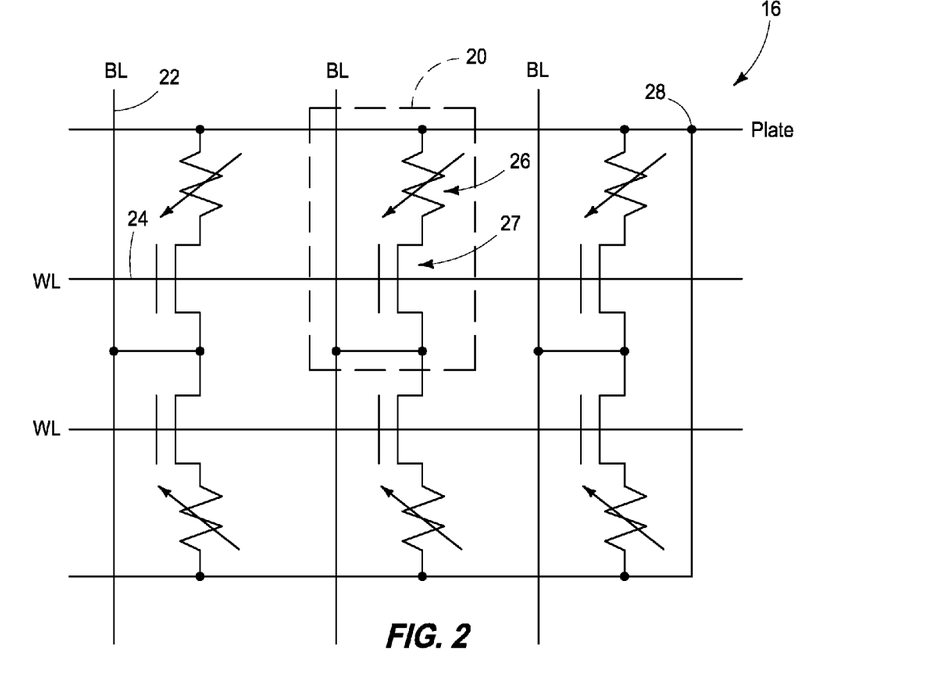
FIG. 2 is a schematic representation of a memory array according to one embodiment.

Referring to FIG. 2, one embodiment of memory 16 is shown in an array which includes a plurality of memory cells 20. The memory cells 20 are coupled with a plurality of bit lines 22, a plurality of word lines 24, and a plate electrode 28. The memory cells 20 are individually capable of being programmed to a plurality of different memory states to store data at moments in time. Memory 16 is accessible to the user and/or associated device for storage of digital information.

The memory cells may be configured as non-volatile cells in one embodiment. In one specific example embodiment, memory 16 is implemented as conductive bridge random access memory (CBRAM) and the memory cells 20 are one transistor/one resistor (1T1R) conductive bridge memory cells which have different electrical resistances corresponding to different memory states of the memory cells. Other arrangements and/or types of the memory cells 20 may be used.

Appropriate voltage potentials may be applied across the memory cells 20 using the bit lines 22 and plate electrode 28 to program the memory cells 20 to appropriate states. As shown in FIG. 2, an individual memory cell includes a memory element 26 coupled in series with an access transistor 27. A gate of access transistor 27 is coupled with a respective word line 24 and plural terminals of the transistor 27 are coupled with memory element 26 and bit line 22. Word line 24 is used to select the memory cell 20 for reading/writing/verification and bit line 22 and plate electrode 28 are used to conduct appropriate signals for the reading/writing/verification of the memory cell 20. In one specific example CBRAM embodiment, the application of programming signals via the bit line 22 and plate electrode 28 form and remove electrically conductive structures within memory element 26 to provide the respective memory cell 20 with different electrical resistances corresponding to different memory states.

Figure 3:
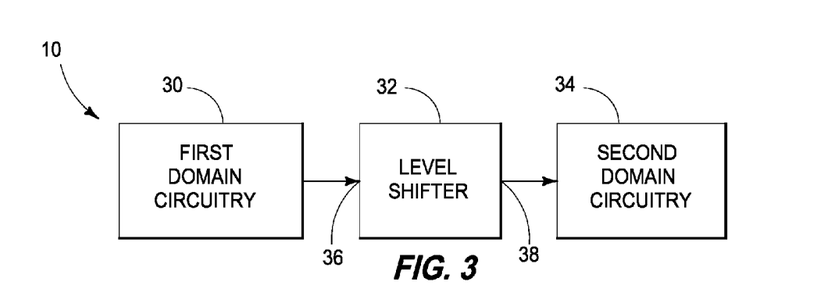
FIG. 3 is a block diagram of circuitry of the memory system according to one embodiment.

Referring to FIG. 3, the memory system 10 includes first domain circuitry 30, a level shifter 32, and second domain circuitry 34 in one embodiment. First domain circuitry 30 and second domain circuitry 34 include respective circuits which operate in different voltage domains or ranges, and one or both of circuitry 30, 34 (as well as shifter 32) may be within a memory device, such as a memory chip.

First domain circuitry 30 includes circuits which operate within a first voltage domain (e.g., Vcc domain of 0-1 V) while second domain circuitry 34 includes circuits which operate within a second voltage domain (e.g., Vpp domain of 0-5 V). Level shifter 32 includes an input 36 configured to receive signals within the first voltage domain outputted from first domain circuitry 30 and an output 38 configured to output signals within the second voltage domain to second domain circuitry 34.

The input signals may have different voltages in the first voltage domain corresponding to different states (e.g., high or low) and transitions between the different voltages/states. The output signals also have different voltages in the second voltage domain corresponding to different states as well as transitions between the different voltage/states. In one embodiment, level shifter 32 is configured to shift (e.g., increase) the voltage level of received input signals and to generate output signals which have states and transitions corresponding to the states and transitions of the input signals while being within a higher voltage domain than the input signals in one embodiment.

In one embodiment, level shifter 32 is coupled with and configured to provide output signals within the higher voltage domain to memory circuitry, such as circuitry of the array of memory cells in FIG. 2. For example, the output signals in the higher voltage domain may be used within the memory array to implement data storage or access operations, and may be used in charge pumping and voltage regulation operations of the memory circuitry in some more specific examples. The input signals include signals received from outside of the memory system 10 (e.g., may include off-chip signals) and signals originating from within the memory system 10, for example from controller 12 in an example embodiment, and the level shifter 32 outputs signals in the higher voltage domain for use within the memory system 10 or which may be outputted externally of the memory system 10.

Figure 4:
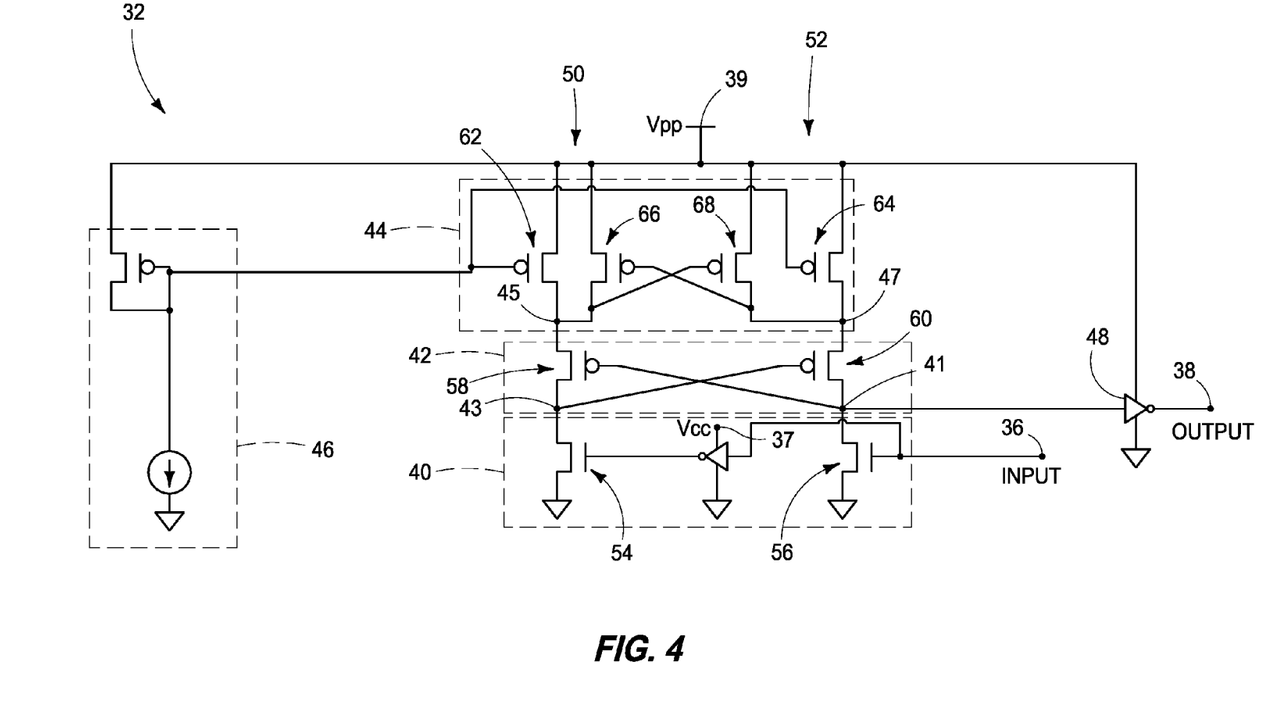
FIG. 4 is a schematic representation of level shifter circuitry according to one embodiment.

Referring to FIG. 4, one embodiment of level shifter 32 is shown. The illustrated level shifter 32 is configured to provide output signals of a higher or increased voltage domain compared with the input signals. The level shifter may be configured to provide output signals of a lower or reduced voltage domain compared with the input signals in other embodiments.

The level shifter 32 includes pull-down circuitry 40, switching circuitry 42 and charging circuitry 44 in the illustrated configuration. Electrical energy sources (e.g., voltage sources 37, 39) provide operational electrical energy to level shifter 32 in the example embodiment. In addition, bias circuitry 46 provides a biasing signal to charging circuitry 44. Voltage source 37 may provide a Vcc voltage of approximately 0-1V compared with voltage source 39 which provides a Vpp voltage of 0-5 V in one embodiment. The Vpp of voltage source 39 may be higher in other embodiments, for example, providing an upper voltage of 7-9 V in other examples.

Pull-down circuitry 40 is configured to selectively pull-down an output node to generate the output signals. Circuitry 40 may also be referred to as conversion circuitry since input signals in a lower voltage domain are received within the circuitry 40 and output signals in a higher voltage domain are generated.

Switching circuitry 42 is implemented as a half-latch configured to provide switching of the level shifter 32 to provide transitions in the output signal corresponding to transitions in the input signal and switching circuitry 42 may also be referred to as pull-up circuitry. Charging circuitry 44 is configured to provide charging current to an output node 41. Pull-down circuitry and pull-up devices of switching circuitry 42 described below pull output node 41 to a low voltage level or to a high voltage level to provide an output signal having logic state corresponding to the input signal. Additional operations of circuits 40, 42, and 44 are described further below.

Circuitry 40, 42 and 44 is implemented in a plurality of circuit branches 50, 52 in the illustrated embodiment of level shifter 32. In particular, circuit branch 50 includes a pull-down device 54, a pull-up device 58 and plural charging devices 62, 66 coupled in parallel with one another and circuit branch 52 includes a pull-down device 56, a pull-up device 60 and plural charging devices 64, 68 coupled in parallel with one another. Bias circuitry 46 is configured to apply current mirrored bias signals to gates of devices 62, 64 and level shifter 32 may be referred to as a current mirroring level shifter in one embodiment.

Pull-down devices 54, 56 are implemented as NMOS transistors and devices 58, 60, 62, 64, 66, and 68 are implemented as PMOS transistors in the depicted embodiment. Devices 56 and 60 are coupled at a node 41, devices 54 and 58 are coupled at a node 43, devices 58, 62, and 68 are coupled at a node 45, and devices 60, 64 and 68 are coupled at a node 47.

An inverter 48 is provided intermediate output node 41 and output 38 and is configured to invert electrical energy received from output node 41. PMOS devices 62, 64 are configured to supply charging electrical energy from source 39 to switching circuitry 42 and may be referred to as supply devices or circuitry in one embodiment.

As described further below in one embodiment, charging devices 66, 68 also operate to provide charging electrical energy from source 39 to switching circuitry 42 during transitions in the output signal and may be referred to as dynamic devices.

As mentioned above, level shifter 32 is configured to output signals at output 38 in the second voltage domain different than the signals received at input 36 in the first voltage domain which has a corresponding voltage range less than the range of the second voltage domain. In addition, the level shifter 32 generates the output signals having transitions corresponding to transitions in the input signal.

For example, a logic high input signal at input 36 turns on pull-down device 56 which pulls node 41 low resulting in a logic high output signal at output 38. In addition, while pull-down device 56 is on, pull-down device 54 is off.

As shown in the illustrated embodiment, devices 58, 60 are cross-coupled devices which are cross-coupled with nodes 41, 43, and device 58 is on due to node 41 being low and device 60 is off due to node 43 being high. The transient charging current for node 43 is provided by devices 62, 66 and device 68 remains off and does not deviate pull down current of device 56.

The receipt of a logic low input signal at input 36 results in the generation of a logic low output signal at output 38. It is desired to bring node 41 up quickly for improved I/O delay and power consumption. However, real estate area of the level shifter 32 is desired to be small in some embodiments, for example, for use in memory applications where thousands of level shifters 32 may be implemented. In one embodiment, charging devices 62, 64 are also referred to as current limiting devices which operate to limit current from supply 39 to cross-coupled devices 58, 60 which enables use of pull-down devices 54, 56 of reduced size.

However, as described further below with respect to FIG. 5, the limiting of current applied to node 41 negatively impacts I/O speed and power consumption of the level shifter 32 (i.e., faster charging of node 41 provides improved speed and reduced power consumption). Accordingly, in one embodiment, charging devices 66, 68 are provided to dynamically assist with the charging of output node 41 during transitions from logic high to logic low in the output signals. Dynamic charging devices 66, 68 are controlled to selectively provide charging current to the cross-coupled devices 56, 60 and output node 41 to provide an increased rate of charge of the output node 41 following a transition in the input signal compared with a rate of charge resulting from provision of current only using the current limiting charging devices 62, 64.

More specifically, as shown in FIG. 4, gates of dynamic devices 66, 68 are cross-coupled devices where the gates of dynamic devices 66, 68 are cross-coupled with nodes 47, 45, respectively. In addition, a gate of device 58 is coupled with the output node 41 and a gate of device 60 is coupled pull-down device 54.

During a transition from logic high to logic low in the input signal, device 56 is off while device 60 is on as a result of device 54 being on and node 43 being low. Furthermore, device 58 is also on and node 45 is low which turns on dynamic device 68. The dynamic device 68 is configured to provide charging current from source 39 to output node 41 in addition to the charging current provided by device 64. Accordingly, dynamic device 68 operates to conduct charging current in parallel with device 64 to charge output node 41 which improves the rate of charging of node 41 compared with charging of node 41 only using device 64.

The provision of the parallel charging signals to the output node 41 causes a transition in the output signal from logic high to logic low in one embodiment. Dynamic devices 66, 68 only conduct current as a result of transitions in the input signal and are otherwise off and do not conduct current in one embodiment. Accordingly, dynamic devices 66, 68 operate to only conduct current resulting from transitions in the input signal and do not contribute to standby or leakage current from source 39 to ground or contribute to fight back between devices 56, 64 when node 41 is pulled low.

The inversion of electrical energy at the output node by inverter 48 provides non-inverting operation of the level shifter 32 wherein the state of the output signal corresponds to the state of the input signal. In another embodiment, the electrical energy at node 43 may be used to generate output signals in implementations where inverting operations of the level shifter 32 are desired.

In one embodiment, the PMOS devices 58, 60 can be of relatively small size and the pull-down devices 54, 56 may also be made relatively small depending upon various parameters including the distribution of the bias voltage from bias circuitry 46, worst overdrive of the pull-down devices 54 (e.g., Vcc−Vth), worst process/temperature corners (slow/−40° C.), and current variation in devices 62, 64 and performance requirements.

Figure 5:
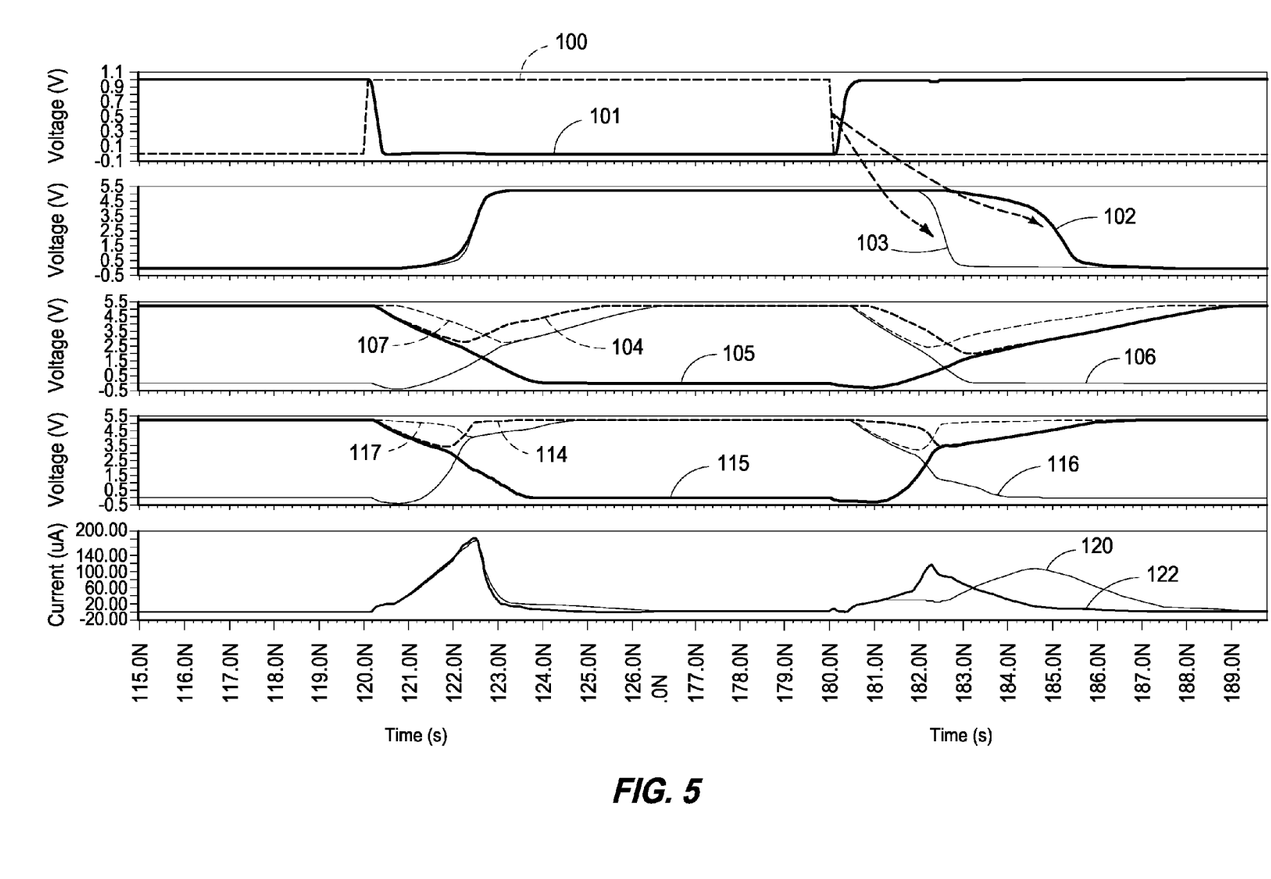
FIG. 5 is a timing diagram of signals of a conventional level shifter and one embodiment of the level shifter shown in FIG. 4.

Referring to FIG. 5, a plurality of signals of the level shifter 32 of FIG. 4 are shown resulting from transitions in the input signal. In addition, a plurality of signals of a conventional level shifter (i.e., without dynamic devices 66, 68) are also shown resulting from transitions in an input signal for comparison purposes.

In the top graph of FIG. 5, line 100 represents a voltage of an input signal in a first voltage domain (i.e., low voltage domain) and which transitions from a logic low state to a logic high state and thereafter returns to a logic low state. Line 101 represents a voltage of a signal applied to a gate of NMOS device 54 of FIG. 4 and which is inverted with respect to the voltage of the input signal.

In the next lower graph of FIG. 5, line 102 represents a voltage of an output signal of a conventional level shifter and line 103 represents a voltage of an output signal of level shifter 32.

In the next lower graph of FIG. 5, lines 104-107 represent voltages of various nodes of a conventional level shifter without the dynamic devices 66, 68. Line 104 represents a voltage of a node of the conventional level shifter which corresponds to node 47 of the level shifter 32 of FIG. 4, line 105 represents a voltage of a node of the conventional level shifter which corresponds to node 41 of the level shifter 32 of FIG. 4, line 106 represents a voltage at a node of the conventional level shifter which corresponds to node 43 of the level shifter 32 of FIG. 4 and line 107 represents a voltage at a node of the conventional level shifter which corresponds to node 45 of the level shifter 32 of FIG. 4.

In the next lower graph of FIG. 5, lines 114-117 represent voltages of various nodes of the embodiment of the level shifter 32 of FIG. 4. Line 114 represents a voltage at node 47, line 115 represents a voltage at node 41, line 116 represents a voltage of at node 43 and line 117 represents a voltage at node 45.

In the bottom graph of FIG. 5, line 120 represents a current from the source 39 to ground within the conventional level shifter and line 122 represents a current from the source 39 to ground within the embodiment of the level shifter 32 of FIG. 4.

FIG. 5 illustrates various improvements of the level shifter 32 of FIG. 4 compared with the conventional level shifter including faster slew rates and reduced crow-bar currents. As shown by lines 102, 103, the output signal 103 of the level shifter 32 of FIG. 4 falls to a low voltage level in a shorter period of time following a change in transition of the input signal 100 compared with a longer period of time for the output signal 102 of the conventional level shifter. This results from the dynamic charging of node 41 by dynamic device 68 in parallel with the charging provided by device 64.

In particular, referring to line 105 of the conventional level shifter and line 115 of the level shifter 32 of FIG. 4, node 41 of the level shifter of FIG. 4 rises quicker after the transition of the input signal from a high level to a low level compared with the voltage of the conventional level shifter due to the charging provided by the dynamic charging device 68. This illustrates improved input to output (I/O) delay of the level shifter 32 of FIG. 4 compared with the conventional level shifter.

In addition, referring to lines 120, 122, the area under curve 122 of the level shifter 32 of FIG. 4 is smaller compared with the area under curve 121 of the conventional level shifter which illustrates reduced power consumption of the level shifter 32 of FIG. 4 compared with the conventional level shifter. In an example 120 nm (LV)-600 nm (HV) technology, the level shifter 32 provided a delay improvement of 47% at the worst corner and approximately 66% improvement at a typical corner and an energy improvement of 26% at the worst corner and approximately 31% improvement at a typical corner. In one embodiment, PMOS devices 62, 64, 66, 68 are minimum dimension devices and the area increment of the level shifter 32 to include dynamic devices 66, 68 is approximately 5% compared with arrangements which do not include the dynamic devices 66, 68.

The embodiment of the level shifter 32 of FIG. 4 is robust across technology process, voltage and temperature corners. As discussed above, improved speed of the level shifters 32 of the embodiment of FIG. 4 provides reduced timing hit to critical paths and the increased speed of transients provides reduced power consumption compared with conventional level shifters. In addition, the level shifters 32 shown in FIG. 4 may be made sufficiently small for implementation of thousands of the level shifter circuits in a memory array or other circuitry. The level shifter 32 is targeted for near threshold supply (Vcc of 1.2 Volts in one example), wide range of Vpp and wide temperature range (e.g., −40° C. to 115° C.) in one embodiment.

CONCLUSION

In some embodiments, a level shifter comprises an input configured to receive an input signal in a first voltage domain, an output configured to output an output signal from the level shifter in a second voltage domain different than the first voltage domain, a plurality of pull-down devices, and wherein one of the pull-down devices is coupled with the input and the output, a plurality of cross-coupled devices coupled with the pull-down devices and configured to provide transitions in the output signal as a result of transitions in the input signal, a plurality of current limiting devices coupled with the cross-coupled devices and configured to limit a flow of current from a source to the cross-coupled devices, and a plurality of dynamic devices configured to selectively provide charging current from the source to the cross-coupled devices.

In some embodiments, a level shifter comprises an input configured to receive an input signal in a first voltage domain, supply circuitry configured to provide electrical energy from a source to an output node, dynamic circuitry configured to provide electrical energy from the source to the output node during transitions in an output signal, and an output coupled with the output node and configured to output the output signal from the level shifter in a second voltage domain.

In some embodiments, a memory system comprises level shifter circuitry comprising an input configured to receive an input signal in a first voltage domain, pull-up circuitry configured to selectively pull an output node to a high voltage level, pull-down circuitry configured to selectively pull the output node to a low voltage level, charging circuitry configured to provide a plurality of current signals in parallel to the output node to charge the output node following a transition in the input signal, and an output coupled with the output node and configured to output an output signal in a second voltage domain different than the first voltage domain from the level shifter circuitry, and memory circuitry coupled with the level shifter circuitry and configured to use the output signal to store digital data in a plurality of memory cells.

In some embodiments, a level shifter comprises an input configured to receive an input signal in a first voltage domain, first cross-coupled circuitry coupled with a source of electrical energy, second cross-coupled circuitry coupled intermediate the first cross-coupled circuitry and an output node, and an output coupled with the output node and configured to output an output signal from the level shifter in a second voltage domain different than the first voltage domain and the output signal having transitions corresponding to transitions within the input signal.

In some embodiments, a level shifting method comprises receiving an input signal in a first voltage domain, generating an output signal in a second voltage domain different than the first voltage domain and comprising a plurality of transitions corresponding to transitions in the input signal, the generating comprising generating using electrical energy conducted via supply circuitry, conducting electrical energy via dynamic circuitry to provide the transitions in the output signal as a result of transitions in the input signal, and outputting the output signal in a second voltage domain different than the first voltage domain.

In some embodiments, a level shifting method comprises receiving an input signal at an input, the input signal being in a first voltage domain and having a plurality of transitions, charging an output node using electrical energy from a source, outputting an output signal using electrical energy at the output node, the output signal being within a second voltage domain different than the first voltage domain and having a plurality of transitions corresponding to the transitions in the input signal, and wherein the charging comprises charging the output node using electrical energy conducted via a plurality of parallel charging devices during the transitions in the output signal.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

What is claimed is:
1. A level shifter comprising:
an input configured to receive an input signal in a first voltage domain;
first cross-coupled circuitry coupled with a source of electrical energy;

second cross-coupled circuitry coupled between the first cross-coupled circuitry and an output node; and
an output coupled with the output node and configured to output an output signal from the level shifter in a second voltage domain different than the first voltage domain and the output signal having transitions corresponding to transitions within the input signal.

2. The level shifter of claim 1 further comprising current limiting circuitry coupled in parallel with the first cross-coupled circuitry, and wherein the first cross-coupled circuitry is configured to conduct electrical energy to the second cross-coupled circuitry during transitions in the output signal.

3. The level shifter of claim 1 further comprising pull-down circuitry coupled with the input and the output node and configured to selectively conduct electrical energy from the output node to ground.

4. A level shifter comprising:
an input configured to receive an input signal in a first voltage domain;
an output configured to output an output signal in a second voltage domain, wherein the first and second voltage domains are different;
level shifter circuitry coupled with the input and the output and configured to generate the output signal having a plurality of transitions which correspond to a plurality of transitions in the input signal;
wherein the level shifter circuitry comprises a plurality of charging devices which are configured to conduct electrical energy in parallel to one output node which is coupled with the output to provide the transitions in the output signal;
wherein the level shifter circuitry comprises a pull-up circuit coupled with the charging devices and which is configured to conduct the electrical energy from the charging devices to provide the transitions in the output signal from a first state to a second state;
wherein the pull-up circuit comprises a plurality of first cross-coupled devices, and wherein the charging devices are configured to conduct the electrical energy from a source to the first cross-coupled devices; and
wherein the charging devices and one of the first cross-coupled devices are within a first circuit branch of the level shifter circuitry, and wherein one of the charging devices is a second cross-coupled device which is coupled with a third cross-coupled device which is within a second circuit branch of the level shifter circuitry.

5. The level shifter of claim 4 wherein the level shifter circuitry comprises a pull-down circuit which is configured to selectively conduct electrical energy from the output node which is coupled with the output to ground to provide the transitions in the output signal from the second state to the first state.

6. The level shifter of claim 5 wherein the pull-down circuit comprises a pull-down device which is directly coupled with the input and the output node.

7. The level shifter of claim 4 wherein the charging devices conduct the electrical energy in parallel from a common source.

8. The level shifter of claim 4 wherein the second voltage domain includes voltages within a voltage range which is greater than a voltage range of the first voltage domain.

9. The level shifter of claim 4 further comprising bias circuitry configured to provide a bias signal to another of the charging devices.

10. The level shifter of claim 4 wherein the one of the charging devices is configured to only conduct the electrical energy as a result of the transitions in the input signal.

11. The level shifter of claim 10 wherein another of the charging devices is configured to limit the conduction of the electrical energy from a source.

12. A level shifter comprising:
an input configured to receive an input signal in a first voltage domain;
an output configured to output an output signal in a second voltage domain, wherein the first and second voltage domains are different;
first cross-coupled circuitry coupled with a source;
second cross-coupled circuitry coupled between the first cross-coupled circuitry and the output; and
wherein the first cross-coupled circuitry and the second cross-coupled circuitry are configured to conduct electrical energy from the source to the output to provide a plurality of transitions in the output signal.

13. The level shifter of claim 12 wherein the first cross-coupled circuitry and the second cross-coupled circuitry are each configured to conduct the electrical energy from the source as a result of a plurality of transitions in the input signal.

14. The level shifter of claim 12 wherein the first cross-coupled circuitry and the second cross-coupled circuitry are coupled in series with one another between the source and the output.

15. The level shifter of claim 12 wherein the first cross-coupled circuitry and the second cross-coupled circuitry each include a switching device which is configured to selectively conduct the electrical energy from the source to the output.

16. The level shifter of claim 15 wherein the switching devices of the first and second cross-coupled circuitry are coupled in series between the source and the output.

17. The level shifter of claim 15 further comprising an additional switching device which is coupled in parallel with the switching device of the first cross-coupled circuitry, and wherein the additional switching device is configured to selectively conduct electrical energy from the source to the second cross-coupled circuitry.

18. The level shifter of claim 17 wherein the additional switching device and the switching device of the first cross-coupled circuitry are each configured to conduct the electrical energy from the source to the second cross-coupled circuitry as a result of a transition in the input signal.

19. The level shifter of claim 17 wherein the switching devices of the first and second cross-coupled circuitry and the additional switching device are within a first circuit branch, and wherein gates of the switching devices of the first and second cross-coupled circuitry are coupled with nodes in a second circuit branch.

20. The level shifter of claim 17 further comprising bias circuitry configured to provide a bias signal to the additional switching device.

21. The level shifter of claim 17 wherein the additional switching device is configured to limit the conduction of the electrical energy to the second cross-coupled circuitry.

22. The level shifter of claim 21 wherein the switching device of the first cross-coupled circuitry is configured to only conduct the electrical energy from the source as a result of a transition in the input signal.

23. The level shifter of claim 12 wherein the output signal includes the electrical energy conducted via the first and second cross-coupled circuitry.

24. The level shifter of claim 12 wherein the second cross-coupled circuitry comprises a pull-up circuit coupled with the output and the pull-up circuit is configured to conduct the electrical energy from the source to the output to provide the transitions in the output signal from a first state to a second state.

25. The level shifter of claim 24 further comprising a pull-down circuit configured to selectively conduct electrical energy from an output node which is coupled with the output to ground to provide transitions in the output signal from the second state to the first state.

26. The level shifter of claim 12 wherein the second voltage domain includes voltages within a voltage range which is greater than a voltage range of the first voltage domain.

27. The level shifter of claim 12 wherein a switching device of the first cross-coupled circuitry is configured to only conduct the electrical energy from the source as a result of transitions in the input signal.

28. The level shifter of claim 12 wherein the second cross-coupled circuitry is configured to conduct the electrical energy from the source to an output node coupled with the output.

29. The level shifter of claim 1 wherein the first cross-coupled circuitry and the second cross-coupled circuitry are configured to conduct electrical current from the source to the output node.

30. The level shifter of claim 1 wherein a switching device of the first cross-coupled circuitry and a switching device of the second cross-coupled circuitry are coupled in series with one another between the source and the output node.

31. The level shifter of claim 12 wherein the first cross-coupled circuitry and the second cross-coupled circuitry are configured to conduct the electrical energy from the source to the output at the same moment in time.

* * * * *